(12) United States Patent
Hedler et al.

(10) Patent No.: US 7,274,107 B2
(45) Date of Patent: Sep. 25, 2007

(54) SEMICONDUCTOR DEVICE

(75) Inventors: Harry Hedler, Germering (DE);
Thorsten Meyer, Erlangen (DE);
Andreas Wolter, Markt Schwaben (DE)

(73) Assignee: Infineon Technologies AG, Munich (DE)

( * ) Notice: Subject to any disclaimer, the term of this patent is extended or adjusted under 35 U.S.C. 154(b) by 28 days.

(21) Appl. No.: 11/038,465

(22) Filed: Jan. 21, 2005

(65) Prior Publication Data
US 2006/0163727 A1    Jul. 27, 2006

(51) Int. Cl.
*H01L 23/48*   (2006.01)
*H01L 23/52*   (2006.01)
*H01L 29/40*   (2006.01)

(52) U.S. Cl. .................. 257/783; 257/787; 257/784; 257/778; 257/E23.181

(58) Field of Classification Search ............. 257/783, 257/784, 778, 787
See application file for complete search history.

(56) References Cited

U.S. PATENT DOCUMENTS

| | | | |
|---|---|---|---|
| 6,429,372 B1 * | 8/2002 | Taguchi et al. | 174/535 |
| 6,455,354 B1 * | 9/2002 | Jiang | 438/118 |
| 6,903,464 B2 * | 6/2005 | Corisis | 257/784 |

* cited by examiner

*Primary Examiner*—Nitin Parekh
(74) *Attorney, Agent, or Firm*—Eschweller & Associates, LLC

(57) ABSTRACT

The present invention relates to semiconductor devices. According to the present invention a semiconductor device is described, comprising: a substrate for carrying a semiconductor chip on a first surface of said substrate; said semiconductor chip being punctually attached to said substrate on said first surface of said substrate via a single attachment point; and means for protecting said semiconductor chip on said first surface of said substrate at least protecting said semiconductor chip laterally.

18 Claims, 7 Drawing Sheets

SEMICONDUCTOR DEVICE

BACKGROUND OF THE INVENTION

1. Field of the Invention

The present invention relates to semiconductor devices, and more particularly to an assembly comprising a semiconductor chip and a package, especially a chip and a substrate in a wirebond-up ball grid arrays (BGA) and window-BGA packages, with an enhanced thermomechanical reliability.

2. Description of the Prior Art

Thermomechanical reliability of semiconductor devices, especially BGA like wirebond-up BGA or window-BGA packages, is a key element with regard to the overall reliability of such devices. Changes in temperature of the semiconductor devices while in operation bear a big potential of risk due to different materials having different coefficients of thermal expansion (CTE), since they expand differently causing mechanical tensions or mechanical stress whenever different elements consisting of different materials are rigidly attached to one another.

Known packages in their construction are typically based on the mechanical and/or electrical connection of three elements as shown in FIG. 17: A semiconductor chip A, an interposer substrate B with interconnect balls C preferably consisting of solder, and a protection D at least protecting the semiconductor chip A preferably consisting of a polymer. These three elements are usually holohedrally mounted on or with another, that means predominantly connected like glued or molded holohedrally on or with another. Thereby, within the package or housing, a complete and rigid connection within the three elements exists.

Since at least two of these elements, semiconductor chip and substrate, have different thermomechanical properties, especially differing coefficients of thermal expansion (CTE Chip about 3 ppm/K; CTE substrate about 16 ppm/K) with the third element (protection) having thermomechanical properties somewhere in between (CTE protection about 10 ppm/K), however at a temperature change an internal mechanical stress E shown in FIG. 18 results inevitably. The consequences are deflections and distortions of the package inevitably decreasing its reliability. With these regular packages it is not possible to fulfill future reliability requests, for instance >2 kTC −45/120° C. or −45/155° C.

It is a principle object of the present invention to provide a semiconductor device reducing or eliminating thermomechanical tensions or stress resulting in an increased thermomechanical reliability.

In accordance with a first aspect of the present invention, there is provided a semiconductor device, comprising: a substrate for carrying a semiconductor chip on a first surface of said substrate; said semiconductor chip being punctually attached to said substrate on said first surface of said substrate via a single attachment point; and means for protecting said semiconductor chip on said first surface of said substrate at least protecting said semiconductor chip laterally.

According to a second aspect of the present invention, a semiconductor device is provided, comprising: a substrate for indirectly carrying a semiconductor chip via a protection means on a first surface of said substrate, wherein said means for protecting said semiconductor chip is attached to said substrate protecting said semiconductor chip from all sides except the side facing said first surface of said substrate, and said protection means is punctually attached to said semiconductor chip via a single attachment point on the opposite side of said side facing said substrate.

In accordance with a third aspect of the present invention, a semiconductor device is provided, comprising: a substrate having a first coefficient of thermal expansion (CTE) for carrying a semiconductor chip on a first surface of said substrate; said semiconductor chip having a second coefficient of thermal expansion different from said first coefficient of thermal expansion; means for punctually attaching said semiconductor chip to said substrate situated laterally adjacent said semiconductor chip; and means for compensating a different thermal expansion of said substrate and said semiconductor chip at said attachment points, said compensation means having a third coefficient of thermal expansion different from said first and second coefficient of thermal expansion of said substrate and said semiconductor chip, and said compensation means being attached to said semiconductor chip and to said attachment points in between said semiconductor chip and said attachment points.

According to a fourth aspect of the present invention a semiconductor device is described, comprising: a substrate having a first coefficient of thermal expansion (CTE) and a persistent opening for accommodating a semiconductor chip having a second coefficient of thermal expansion within said opening; and a compensations means having a third coefficient of thermal expansion laterally surrounding said semiconductor chip in between said substrate and said semiconductor chip for compensating a different thermal expansion of said substrate and said semiconductor chip.

Thereby, a concept is realized in which the composition of at least two elements, i.e. substrate, semiconductor chip, and preferably protection, is not holohedrally provided. Instead, a connection between the three elements exists only at predetermined attachment points which are thermomechanically neutral. That means that at these attachment points no relative movement of the elements exists at a change of temperature even without attachment. All other points of the three elements can move independently from one another, especially expand or shrink at a temperature change without inducing forces or stresses within the device.

These thermomechanically neutral points can be punctual attachment or connection points between two elements of the composition at predetermined positions. All thermomechanically neutral points are located on compensation lines, i.e. lines where even without attachment no thermally induced relative motion of the chip with respect to the substrate occurs. One or more attachment points can freely be located on such a compensation line.

Thereby a connection or an attachment point is provided at a predetermined location which is selected so that two elements attached to another having different coefficients of thermal expansion seen from a fixed point have the same thermal expansion at that predetermined location as a third material at that point seen from the fixed point at a change of temperature.

If two composition elements are attached with one another via one attachment point only per contact level, that means not laminar, due to a thermally induced expansion, no stress results, since starting from this fixed point, all other volume elements of the contact partners can move freely. If the three elements of the package, i.e. semiconductor chip, substrate, protection, are only attached to one another via these neutral fixed points, it is possible to assemble a stress-free package or housing which does not bend, twist or distort. If a fixed point is set on the front side of a contact element, the respective fixed point on the backside is arranged preferably symmetrically in order to provide a symmetric assembly.

All different aspects of the present invention increase the thermomechanical reliability in that the packages are internally stress-free, i.e. first-level reliability, and in addition are adapted stress-free to the next level of the device architecture, that means second-level reliability. Not every attachment point is necessarily the center of the device. However, the attachment point is preferably situated in the center or near the center within the semiconductor device due to the same amount of expansion in all directions of one level at a change of temperature.

According to a preferred embodiment of the first and second aspect of the present invention as far as said substrate is concerned, said single attachment point is located in or close to the center of said substrate.

According to a further preferred embodiment of the first and second aspect of the present invention as far as said semiconductor chip is concerned, said single attachment point is located in or close to the center of said semiconductor chip.

According to a further preferred embodiment of said first and second aspect of the present invention, said substrate is connected to a carrier, i.e. a circuit board on a second surface of said substrate opposite said first surface via solder, preferably solder bumps, or electrically conductive adhesive.

According to a further preferred embodiment of said first and second aspect of the present invention, said substrate has the same or a comparable coefficient of thermal expansion (CTE) as said carrier.

According to a further preferred embodiment of said first and second aspect of the present invention, said protection means covers said semiconductor chip from all sides except the side facing said first surface of said substrate.

According to a further preferred embodiment of the first and second aspect of the present invention, said protection means is attached to said semiconductor chip punctually via a single attachment point symmetrically to said attachment point between said chip and said substrate. That means that the center position of the chip, the substrate and the protection means respectively and the position of the attachment points of the chip with the substrate and the attachment points of the chip with the protection means is the same respectively.

According to a further preferred embodiment of the first, second and third aspect of the invention, said protection means is spaced apart from said semiconductor chip at least so far that within the entire operation temperature range, preferably about 248 K to 448 K, said semiconductor chip does not touch or apply a force on said protection means.

According to a further preferred embodiment of the first and second aspect of the present invention, in between said substrate and said semiconductor chip a slip agent, preferably silicone, is arranged.

According to a further preferred embodiment of the first, second and third aspect of the present invention, said protection means has the same or a comparable coefficient of thermal expansion (CTE) as said substrate.

According to a further preferred embodiment of the first, second and third aspect of the present invention, said protection means consists of a stainless steel, an alloy, nickel silver or plastics, preferably a polymer.

According to a further preferred embodiment of the first and second aspect of the present invention, said semiconductor chip is electrically connected to a second surface of said substrate through a window, preferably in a center axis of said substrate, in said substrate via bond wires.

According to a further preferred embodiment of the first aspect of the present invention, said protection means is elastic, preferably consisting of a shrunk-on hose, being slidingly arranged on said semiconductor chip.

According to a further preferred embodiment of the first, second and third aspect of the present invention, said punctual attachment is formed by an adhesive, which preferably is epoxy-based.

According to a preferred embodiment of the third aspect of the present invention, said semiconductor chip is punctually attached to said substrate in addition via a single attachment point in or near the center of said semiconductor chip.

According to a further preferred embodiment of the third aspect of the present invention, said compensation means has a predetermined lateral extension, said predetermined lateral extension of said compensation means being selected dependent on the lateral extension of said semiconductor chip from its center and the distance from said center to said lateral attachment points as well as dependent on said third coefficient of thermal expansion.

According to a further preferred embodiment of the third aspect of the present invention, said predetermined lateral extension of said compensation means is determined by multiplying the lateral extension of said semiconductor chip from its center by the difference of the second coefficient of thermal expansion minus the first coefficient of thermal expansion divided by the difference of the first coefficient of thermal expansion minus the third coefficient of thermal expansion.

According to a further preferred embodiment of the third aspect of the present invention, in between said substrate and said semiconductor chip as well as in between said substrate and said compensation means a slip agent, preferably silicone, except at said attachment points, is arranged.

According to a further preferred embodiment of the third aspect of the present invention, said lateral attachment points are equidistant from the center of said semiconductor chip.

According to a further preferred embodiment of the third aspect of the present invention, said lateral attachment points are arranged crosswise or diagonally with respect to said semiconductor chip.

According to a further preferred embodiment of the third aspect of the present invention, said semiconductor chip is located in the center of said substrate.

According to a further preferred embodiment of the third aspect of the present invention, said chip is electrically connected to the first surface of said substrate via bond wires lateral of said semiconductor chip.

According to a further preferred embodiment of the third aspect of the present invention, said compensation means forms a frame surrounding said semiconductor chip laterally.

BRIEF DESCRIPTION OF THE DRAWINGS

Embodiments of the invention are now described, by way of example only, with reference to the following drawings, in which.

DETAILED DESCRIPTION OF THE PREFERRED EMBODIMENTS

It is to be noted that in the following description like reference signs are used for like or comparable elements.

Figure 1:
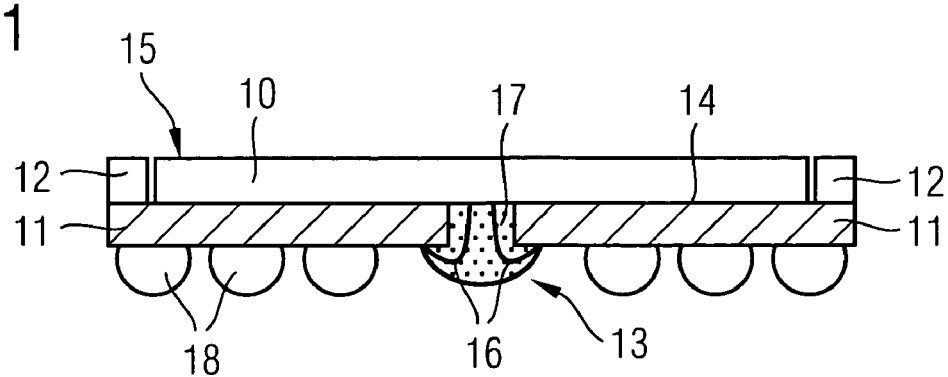
FIG. 1 shows a cross-sectional side view of a semiconductor device according to a first embodiment of the invention.

In FIG. 1, a cross-sectional side view of a semiconductor chip 10 is shown on a substrate 11. Said semiconductor chip 10 is laterally surrounded by a protection means 12 forming a protection ring and extending vertically at least as high as said semiconductor chip 10. The substrate 11 extends laterally beyond said semiconductor chip 10 allowing the protection means 12 to be attached to the substrate 11 on the same first surface of the substrate 11. The protection means 12 is rigidly attached to the substrate 11, for instance glued or soldered. The chip 10 is attached to the substrate 11 via a single attachment point 13 preferably situated in the center as well of the semiconductor chip 10 as well as the center of the substrate 11. Only at that one punctual attachment point 13, the semiconductor chip 10 is rigidly attached to the substrate 11.

In between the first surface of the substrate 11 and the semiconductor device 10 at except the attachment point 13, preferably a slip agent 14 is disposed in order to provide a free movement of the semiconductor chip 10 with respect to the substrate 11 except at the attachment point 13. The attachment point is preferably provided by an adhesive, for instance an epoxy. In between the semiconductor chip 10 and the laterally adjacent protection means 12, a predetermined space 15 is provided in order for the semiconductor chip 10 to expand laterally without reaching the protection means 12 or applying a force on said protection means 12 at a change of temperature. In the free space 15 of FIG. 1 according to another embodiment (not shown), an elastic material especially a rubber like or jelly type material might be placed at least partly within the free space so that when the semiconductor chip 10 thermally expands, none of said elastic material or liquid or jelly-type material in the free space 15 would overflow.

Electrically, said semiconductor chip 10 is connected to a second surface opposite said first surface of the substrate 11 through bond wires 16 through an opening 17 in said substrate 11 which is preferably located in the center or along a center axis of the substrate 11. The connection between the substrate 11 and a further level, for instance a printed circuit board (PCB), is preferably provided by solder bumps 18. The substrate 11 and the protection 12 preferably have the exact same or a like coefficient of thermal expansion, for instance about 16 ppm/K, preferably identical to the coefficient of thermal expansion of the next level board, for instance a printed circuit board. Thereby, a stress-free connection between substrate 11 and protection 12 is provided. The protection 12 serves as a lateral guard against shearing or impacts. The embodiment according to FIG. 1 shows a window-ball grid array (BGA) which even at temperature changes does not bend or distort.

Figure 2:
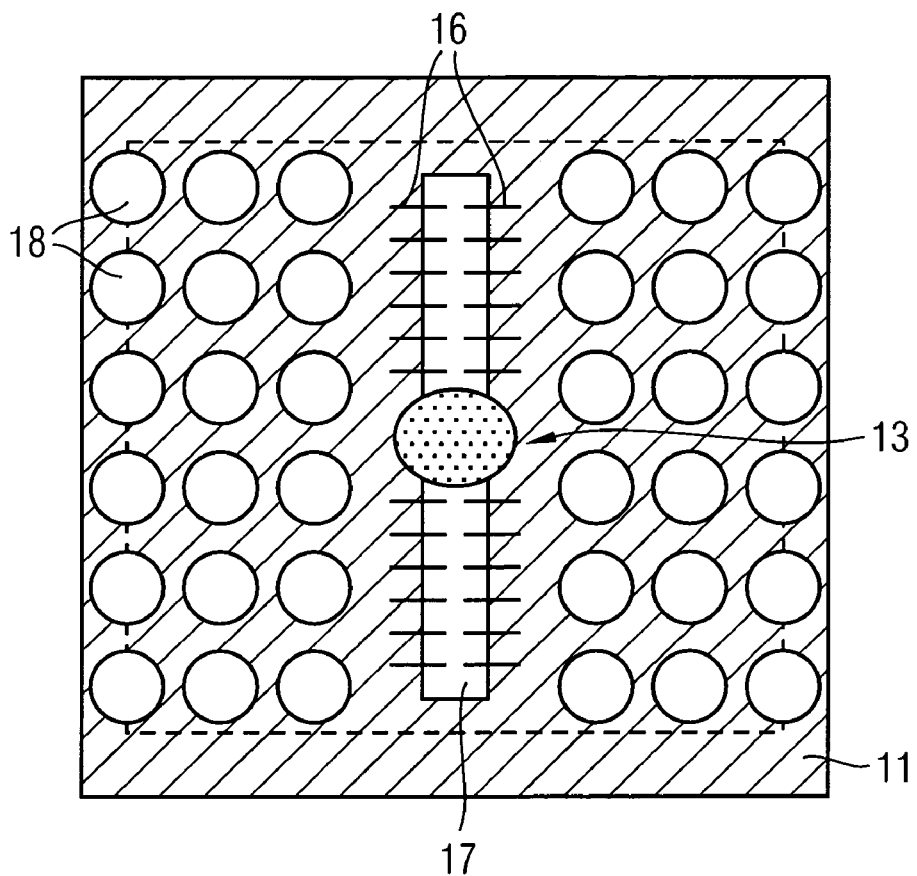
FIG. 2 shows a bottom view of the semiconductor device of FIG. 1.

FIG. 2 shows a bottom view of the embodiment of FIG. 1 in which the position of the semiconductor chip 10 is indicated by the dotted line is rigidly attached to the substrate 11 by a single attachment point 13 large enough to connect substrate and chip even when located in the center of the opening of the substrate. As could be seen from the bottom view in FIG. 2, the opening 17 in the substrate 11 is preferably stretched along a center axis of said substrate 11. The solder bumps 18 for the second level connection form an array of connection means which are connected to the bond wires 16 via electrically conductive redistribution lines not shown in FIG. 2.

Figure 3:
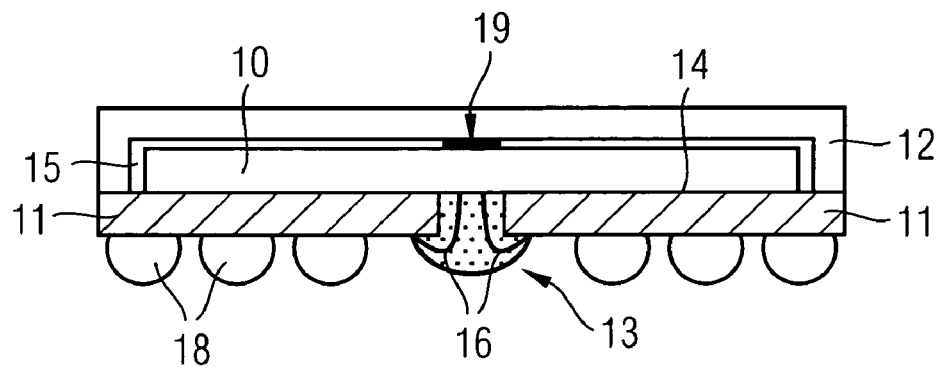
FIG. 3 shows a cross-sectional side view of a semiconductor device according to second embodiment of the present invention.

A further embodiment shown in FIG. 3 differs from the embodiment described with respect to FIGS. 1 and 2 in that the protection means 12 does not only surround the semiconductor chip 10 laterally, but completely covers said semiconductor chip 10 from all five sides except the side facing the first surface of the substrate 11. In the embodiment of FIG. 3 there is also provided sufficient free space 15 in between the protection 12 and the semiconductor chip 10 vertically and horizontally so that the semiconductor chip 10 can expand or contract at a change of temperature at least within the operating temperature range described above without touching the protection means 12 or applying a force on the protection means 12 and/or the semiconductor chip 10 itself due to thermal expansion.

As a further preferred embodiment, another attachment point 19 is provided in between the protection means 12 and the semiconductor chip 10. Preferably, this punctual attachment point 19 is located in the center of said semiconductor chip 10 symmetrical to the punctual attachment point 13 between the substrate 11 and the semiconductor chip 10. The attachment point 19 is preferably also an adhesive, most preferably an epoxy-based adhesive. Not shown with respect to FIG. 3, but another embodiment of the present invention is an assembly like the one of FIG. 3 in which the semiconductor chip 10 is solely punctually attached to the protection means 12 via attachment point 19 without being also directly punctually attached to the substrate 11. In such an assembly, the semiconductor chip 10 is carried indirectly on the substrate 11 via attachment point 19 and the protection means 12 which is rigidly attached to the substrate 11.

In between the substrate 11 and the semiconductor chip 10, preferably a slip agent 14 is disposed. In such a configuration, the bond wires 16 are either freely connected to the second surface of the substrate 11 or are embedded in an elastic material such as a gel-type silicone. The protection means 12 of FIG. 3 forming a cap or a hood preferably consists of a stainless steel, nickel silver, an alloy, or plastics, preferably a polymer.

Figure 4:
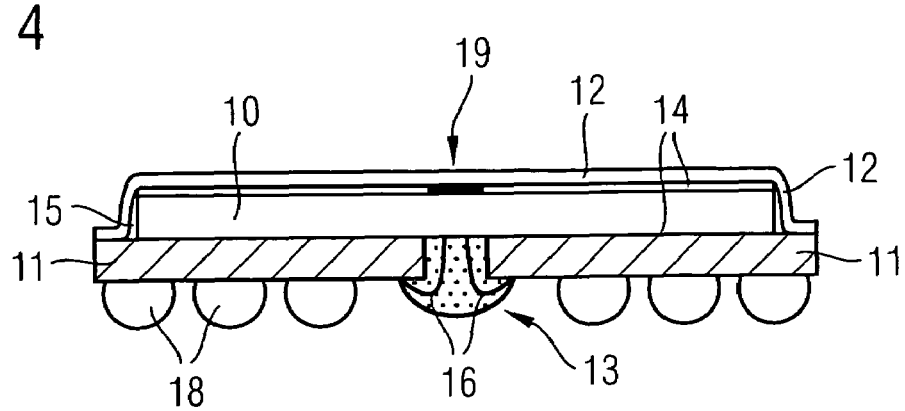
FIG. 4 shows a cross-sectional side view of a semiconductor device according to a further embodiment of the present invention.

Another preferred embodiment of the present invention is described with respect to FIG. 4, which differs from the embodiment of FIG. 3 in the protection means 12 which according to FIG. 4 is formed by a shrunk-on hose. The shrunk-on hose is adapted to the outer shape of the substrate 11 plus the semiconductor chip 10 preferably at an increased temperature and pressure or in a vacuum oven autoclave. To prevent the shrunk-on hose as protection 12 from sticking holohedrally to the back of the semiconductor chip 10, preferably a silicon chip, preferably a slip agent 14 or a silicone layer can be used. According to a preferred embodiment, the shrunk-on hose as protection means 12 of FIG. 4 stays elastic during temperature changes.

Figure 5:
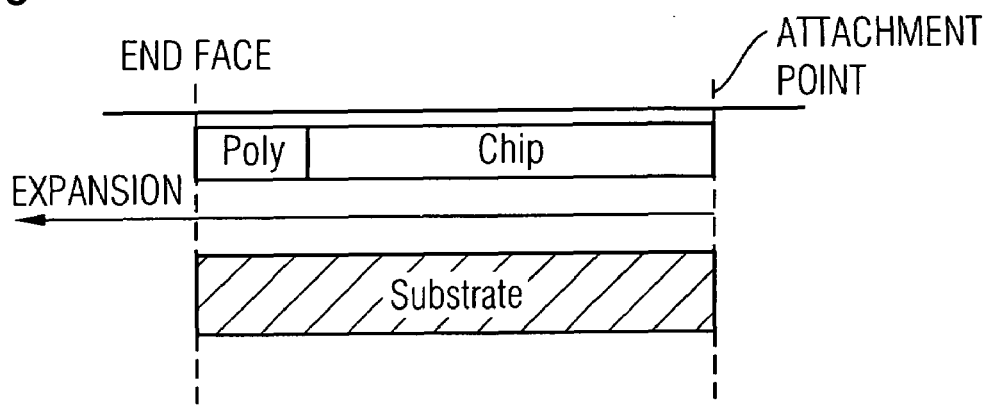
FIG. 5 shows a schematic diagram explaining an aspect of the present invention.

With respect to FIG. 5, another aspect of the present invention is basically described. By combining two materials, e.g. a given material as the chip material having a certain lateral extension and combining it with a compensation material, e.g. a polymer having a selectable coefficient of thermal expansion, it is possible to generate a compound of the chip material and the compensation material both having a predetermined lateral extension at a given temperature expanding in the same way as a given third material like the substrate material at a temperature change. That means that the end face of the composition moves in parallel with the end face of the substrate material at a change of temperature. Therefore, it is possible to set a fixed attachment point for the composition of chip material and compensation means material, e.g. a polymer, common with the attachment point of the substrate. For adapting a semiconductor chip to a substrate at a predetermined distance from a fixed point like a symmetry center, it is possible to create a compensation means surrounding the chip laterally like a frame.

Figure 6:
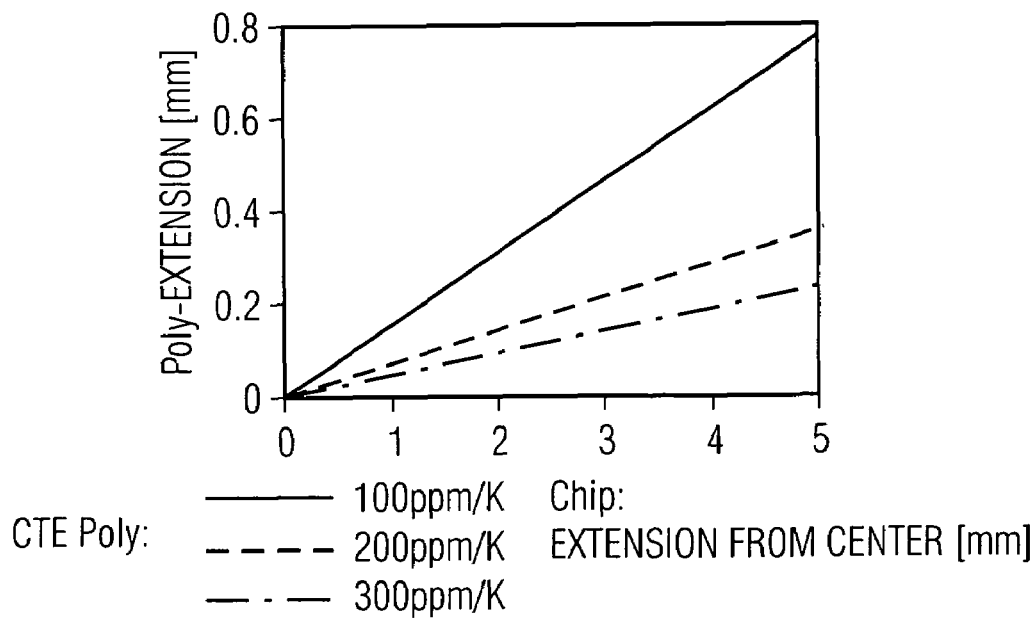
FIG. 6 shows a schematic diagram of a frame size over a chip size depending on coefficients of thermal expansion further explaining FIG. 5.

The lateral extension of the compensation means, for instance a frame laterally surrounding the semiconductor chip, preferably consisting of a polymer, depends on the coefficient of thermal expansion of the substrate, the semiconductor chip and the polymer all having a different coefficient of thermal expansion. Supposed the thermal expansion is a linear relation between the lateral extension of the chip from its center and the lateral extension of the compensation means, especially a polymer frame, the lateral extension of the compensation means is determined by multiplying the lateral extension of said semiconductor chip from its center by the difference of the coefficient of thermal expansion of the chip minus the coefficient of thermal expansion of the substrate divided by the difference of the coefficient of thermal expansion of the substrate minus the coefficient of thermal expansion of the compensation means (polymer). This leads to a diagram as shown with respect to FIG. 6 in which the necessary lateral extension of the compensation means (polyextension) in mm is plotted against the chip extension from its center in mm depending on different coefficients of thermal expansions for the compensation means (CTEpoly).

Figure 7:
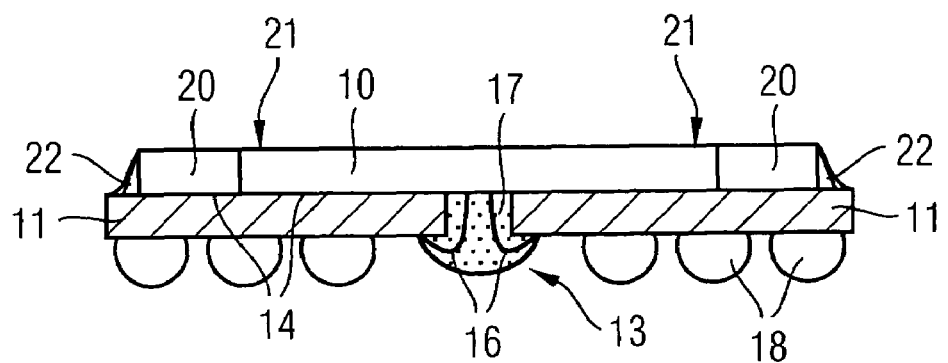
FIG. 7 shows a cross-sectional side view of a semiconductor device according to another embodiment of the present invention.

In the schematic cross-sectional side view in FIG. 7, a semiconductor device using the aforesaid compensation mechanism is shown. A semiconductor chip 10 is located on a first surface of a substrate 11. In between said semiconductor chip 10 and said substrate 11 preferably a slip agent 14, most preferably silicone, is disposed. Laterally surrounding said semiconductor chip 10 is a compensation means 20 which is laterally fixed to said semiconductor chip 10 via an attachment means 21. Said compensation means 20 surrounding said semiconductor chip 10 is as well as the semiconductor chip 10 preferably arranged on a slip agent 14. Lateral attachment points 22 located at the periphery of said compensation means near the outer rim of the substrate 11 secure the semiconductor chip 10 and the compensation means 20 on the substrate 11. Preferably, but not necessarily, said semiconductor chip 10 is also fixed to said substrate 11 via an attachment point 13 in the center of said semiconductor chip 10. The other features shown with respect to FIG. 7 comply with features already described with respect to the preceding Figures.

Said compensation means 20 preferably consists of a polymer. The semiconductor chip 10 and compensation means 20 are only attached to one another at attachment means 21. Only the attachment point 22 between the substrate 11 and the compensation means 20 near the outer rim of the substrate 11 is a rigid connection. The outer attachment points 22 consist of an adhesive which preferably is epoxy-based.

Figure 8:
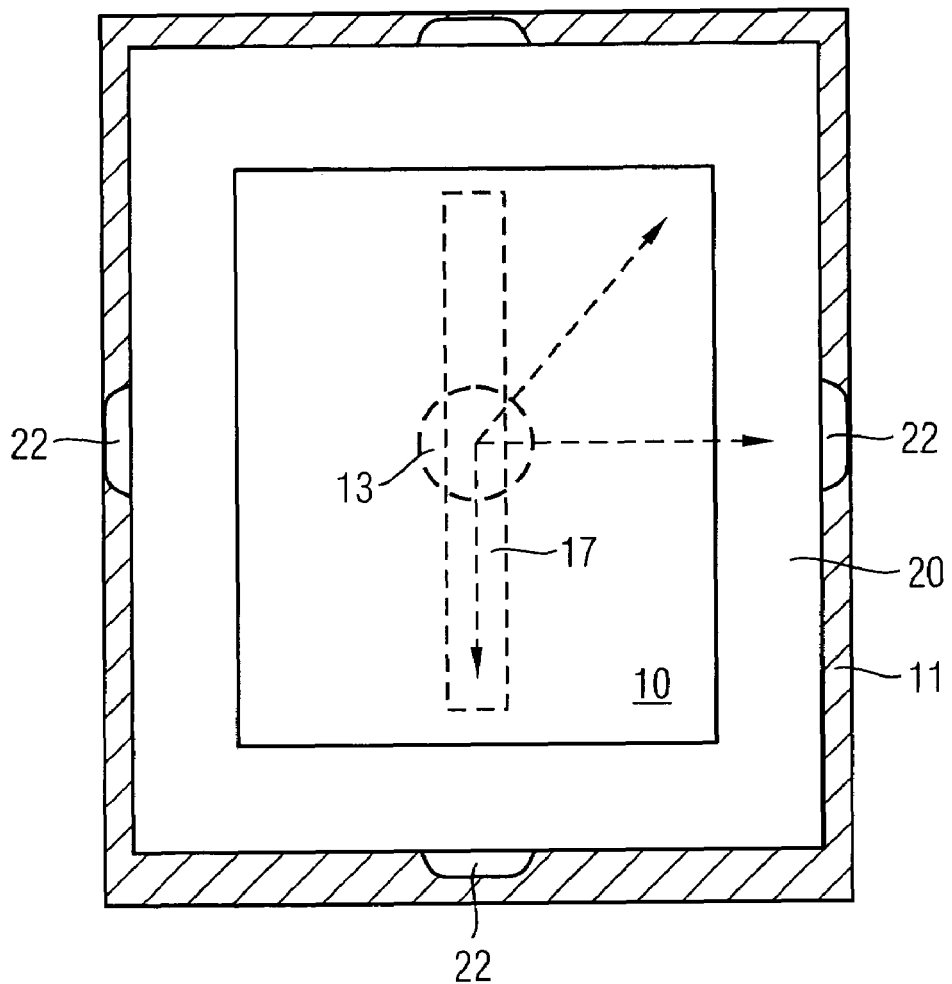
FIG. 8 shows a top view of the semiconductor device according to FIG. 7.

The semiconductor device of FIG. 7 is also shown in FIG. 8 in a top view. Said semiconductor chip 10 is laterally surrounded by the compensation means 20 forming a frame of a compensation material. Via said outer attachment points 22, said compensation means 20 is laterally attached to said substrate 11 preferably near the outer rim of said substrate 11. The attachment points 22 are preferably punctual connections. The compensation means 20 serving as a thermomechanical compensation means is in its lateral extension and in its coefficient of thermal expansion selected dependent on the lateral extension of said semiconductor chip 10 from its center as well as the coefficient of thermal expansion of said semiconductor chip 10 as well as the coefficient of thermal expansion of the substrate 11.

It is selected so that at an attachment point 22 at a change of temperature, no relative movement of the semiconductor chip 10 plus compensation means 20 can be identified with respect to attachment points 22. The coefficient of thermal expansion of the compensation means 20 therefore is different from the one of the semiconductor chip 10 and the one of the substrate 11. It is determined as described with respect to FIG. 5 and 6. As identified by a dotted circle in FIG. 8, a central attachment point 13 between said substrate 11 and the center of said semiconductor chip 10 is only optional. In between said compensation means 20 and said substrate 11, the multiplicity of attachment points is possible as long as they comply with the above-mentioned conditions which means that they are located on a compensation line.

If the semiconductor chip 10 has a square plan view, then the compensation means 20 laterally surrounding said semiconductor chip 10 also has a square plan view meaning that its lateral extension is homogeneous. Lateral attachment points 22 in such a configuration are located on compensation lines. In this embodiment lateral attachment points 22 can be provided along the outer edges of the compensation means 20. Even though shown in FIG. 7, the slide agent 14 in between the substrate 11 and the semiconductor chip 10 and the compensation means 20 is a preferred feature not inevitably necessary.

Figure 9:
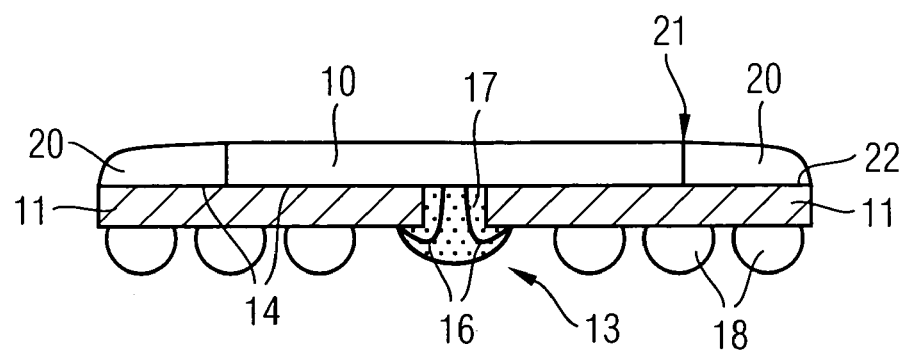
FIG. 9 shows a cross-sectional side view of a semiconductor device according to another embodiment of the present invention.

A preferred embodiment shown in FIG. 9 differs from the one shown with respect to FIG. 7 in that the compensation means 20 is attached to a substrate 11 via an attachment point 22 horizontally between said compensation means 20 and the substrate 11, whereas in FIG. 7 the compensation means 20 is attached to the substrate 11 via a vertical surface of the compensation means 20. The attachment point 22 in FIG. 7 mechanically connects a lateral, vertical surface of said compensation means 20 with the substrate 11.

Figure 10:
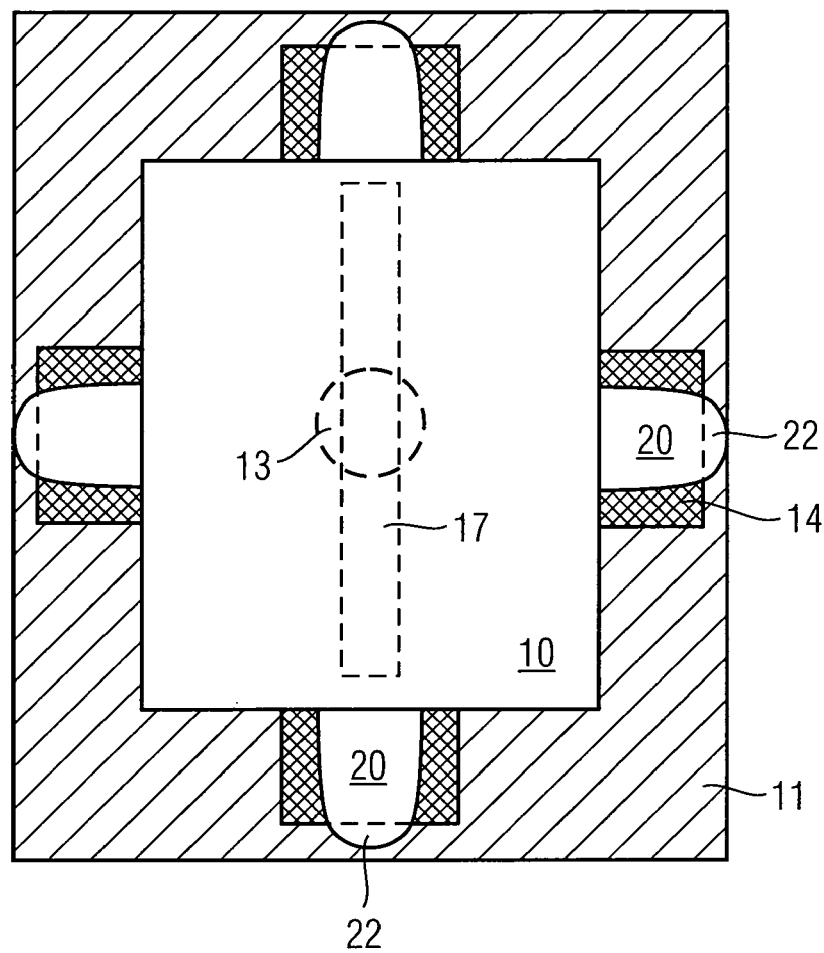
FIG. 10 shows a top view of the embodiment of FIG. 9.

As can be seen from FIG. 10 showing the embodiment of FIG. 9 in a top view, the compensation means 20 in this preferred embodiment does not build a frame laterally surrounding completely the semiconductor chip 10, but instead has four compensation means 20 being crosswise arranged. Here also the compensation means 20 is only fixed to the substrate 11 punctually at attachment points 22. The semiconductor chip 10 and the compensation means except optional attachment point 13 in the center of said semiconductor chip 10 are movable on said substrate preferably bedded on a slide agent 14 or slide surfaces. A lateral extension of the compensation means 20 radially seen from the center of the semiconductor chip 10 is determined as described above.

Figure 11:
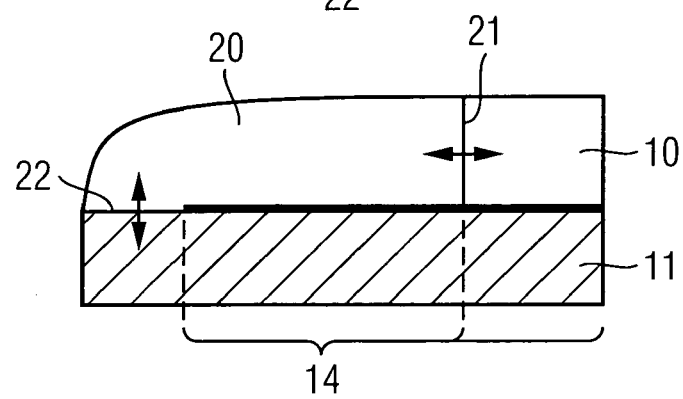
FIG. 11 shows a cross-sectional side view of a detail of the embodiment of FIG. 9.

With respect to FIG. 11, a cross-sectional side view showing in detail the outer rim of the substrate 11 with the attachment point 22 between the compensation means 20 and substrate 11 as well as the lateral attachment means 21 between the semiconductor chip and the compensation means 20 is illustrated. Between the substrate 11 and the compensation means 20 except attachment point 22 and the semiconductor chip 10 preferably a slip agent 14 is located.

Figure 12:
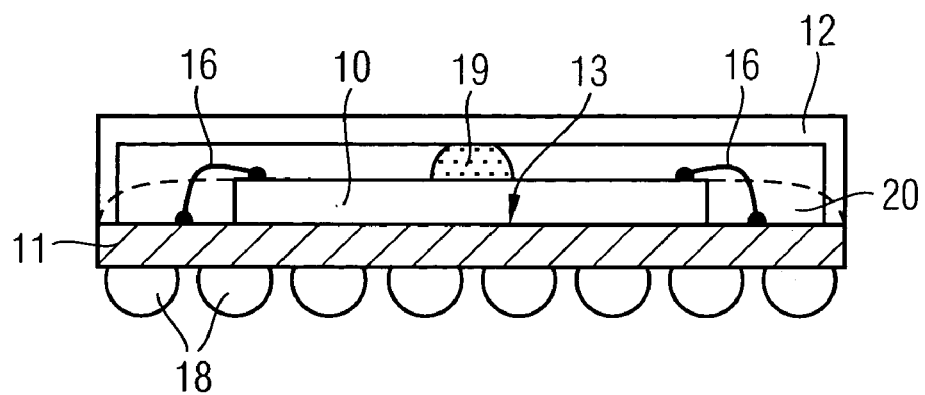
FIG. 12 shows a cross-sectional side view of a semiconductor device according to another embodiment of the present invention.

In FIG. 12, another preferred embodiment of the present invention is shown. The semiconductor device of FIG. 12 is not a window ball grid array as in previously described embodiments. Instead, a semiconductor chip 10 is mounted on a substrate 11 attached to said substrate only via a single attachment point 13 in the center of said semiconductor device 10. The semiconductor device 10 is protected by a protection means 12 completely surrounding the semiconductor chip 10 from all sides except the first surface of the substrate 11 on which the semiconductor chip 10 is mounted. Between the semiconductor chip 10 and the protection means 12, in the center of the semiconductor chip 10 symmetrical to attachment point 13 between the semiconductor chip 10 and the substrate 11, preferably also an attachment point 19 is arranged.

The protection means 12 is rigidly mounted on the substrate 11 having a coefficient of thermal expansion which is identical or at least in the range of the coefficient of thermal expansion of the substrate 11. The semiconductor chip 10 is electrically connected to the substrate 11 via bond wires 16. The bond wires 16 extend from the upper surface of the semiconductor chip 10 to the first surface of the substrate 11. The bond wires 16 are electrically connected to the ball grid array 18 through vias in the substrate 11 (not shown). In the cross-sectional view of FIG. 12 identified by the dotted lines is a compensation means 20 comparable to the one described with respect to FIG. 10, but arranged diagonally in the corner parts of semiconductor chip 10.

Figure 13:
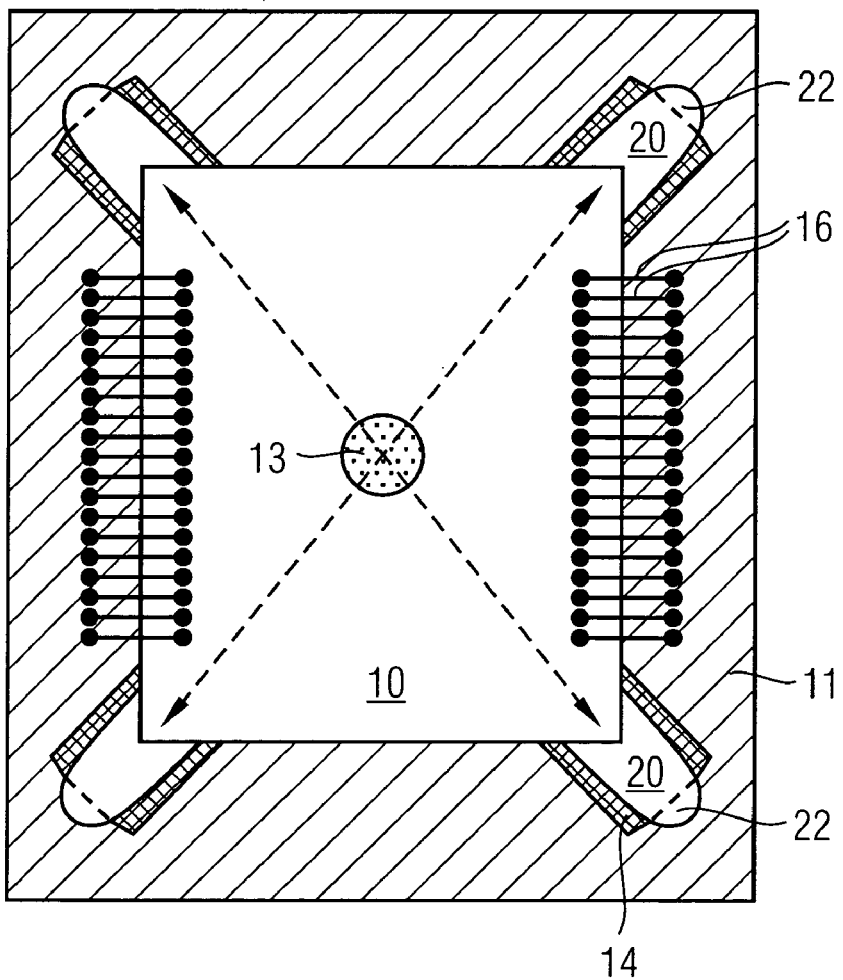
FIG. 13 shows a top view of a semiconductor device according to another embodiment of the present invention.

The embodiment of FIG. 12 is as well shown in FIG. 13 in a top view. In FIG. 13, the protection means 12 is not shown. A semiconductor chip 10 is electrically connected to the substrate 11 via bond wires 16. The compensation means 20 is located in the corners of the semiconductor chip 10 in order to compensate differences of thermal expansion of the semiconductor chip 10 and the substrate 11 at the attachment points 22. In the embodiment of FIG. 13, attachment points 13, 19 in the center of the semiconductor chip 10 are not inevitably necessary, neither between the semiconductor chip 10 and the substrate 11 nor between the protection means 12 and the semiconductor chip 10, since it is mechanically secured on the substrate 11 via the compensation means 20 at the attachment points 22. As well as described before, the coefficient of thermal expansion of the substrate 11 preferably matches the coefficient of thermal expansion of the next level board, preferably a printed circuit board.

If, like in the present invention, a stress-free or stress-reduced assembly is achieved during a change of temperature, the substrate does not only keep even, but in addition the coefficient of thermal expansion (CTE) of the substrate can be selected to match the CTE of the level board, thereby preventing additional mechanical stress at a connection (solder/adhesive) with the next level in the architecture. In addition, due to the reduced or eliminated mechanical stress between a package and the next level board, no big solder balls are necessary. Their function as a stress buffer is not needed resulting in a significant size reduction, especially as far as the diameters are concerned. An assembly like a land grid array with even pads and without big solder balls is sufficient. Thereby, the package height can significantly be reduced by about 300 μm complying with a third of the overall assembly height.

Figure 14:
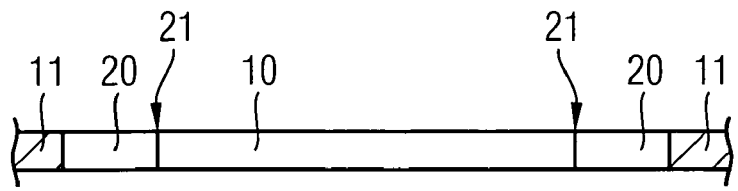
FIG. 14 shows a cross-sectional side view of a semiconductor device according to another embodiment of the present invention.

In the schematic cross-sectional side view in FIG. 14, a further preferred embodiment features a semiconductor device using the aforesaid compensation mechanism. A semiconductor chip 10 is located in a persistent opening of a substrate 11. Laterally surrounding said semiconductor chip 10 is a compensation means 20 which is laterally fixed to said semiconductor chip 10 via an attachment means 21. Said compensation means 20 surrounding said semiconductor chip 10 is as well as the semiconductor chip 10 arranged in said opening of said substrate 11. Lateral attachment points or an attachment edge located at the periphery of said compensation means 20 secures the semiconductor chip 10 and the compensation means 20 within the substrate 11. Preferably said semiconductor chip 10 is electrically connected to said substrate 11 via a conductive connection means 23, e.g. a metal redistribution on top the surfaces of the chip 10, the compensation means 20, and the substrate 11, having a plurality of conductive lines (not shown). Said electrical connection means 23 is located in or close to the middle of one, two or all four of the edges of the chip 10. The electrical connection of the chip 10 to the substrate 11 (not shown) can also be provided by flexible wire bonds. The chip 10 in the opening might as well be covered (not shown) from one or both sides not facing the compensation means 20 as described herein with respect to a protection means.

Figure 15:
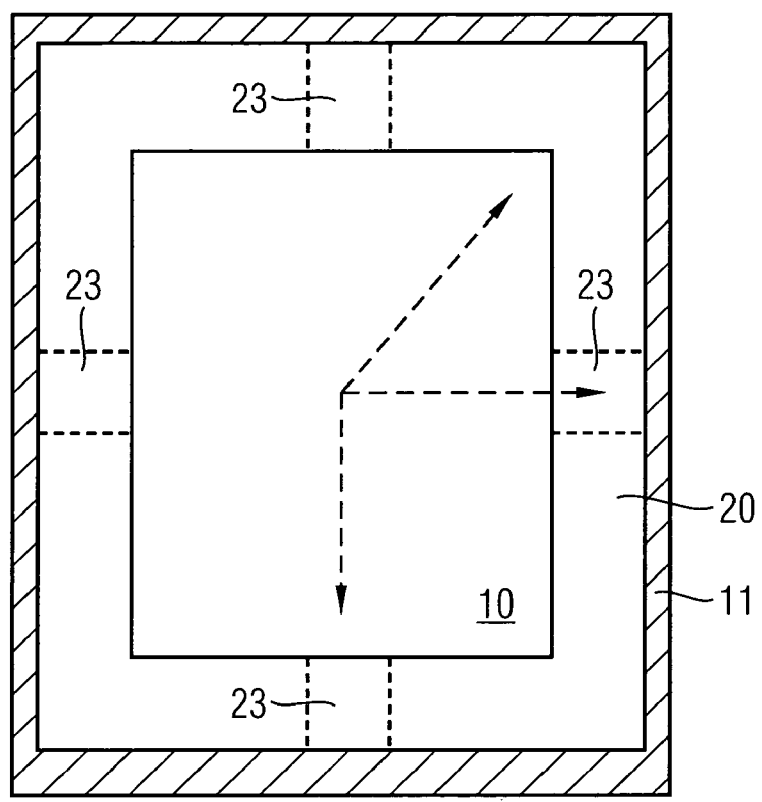
FIG. 15 shows a top view of the semiconductor device according to FIG. 14.

The semiconductor device of FIG. 14 is also shown in FIG. 15 in a top view. Said semiconductor chip 10 is laterally surrounded by the compensation means 20 forming a frame of a compensation material. Said compensation means 20 is laterally attached to said substrate 11 at the outer rim of said compensation means 20. The compensation means 20 serving as a thermomechanical compensation means is in its lateral extension and in its coefficient of thermal expansion selected dependent on the lateral extension of said semiconductor chip 10 from its center as well as the coefficient of thermal expansion of said semiconductor chip 10 as well as the size of the opening in and the coefficient of thermal expansion of the substrate 11.

Figure 16:
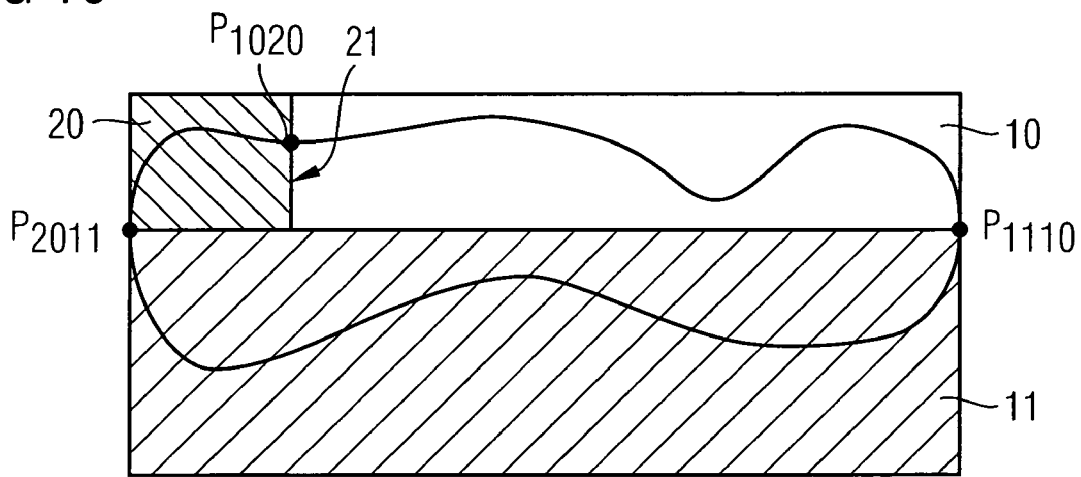
FIG. 16 shows a schematic diagram explaining another aspect of the present invention.
Figure 17:
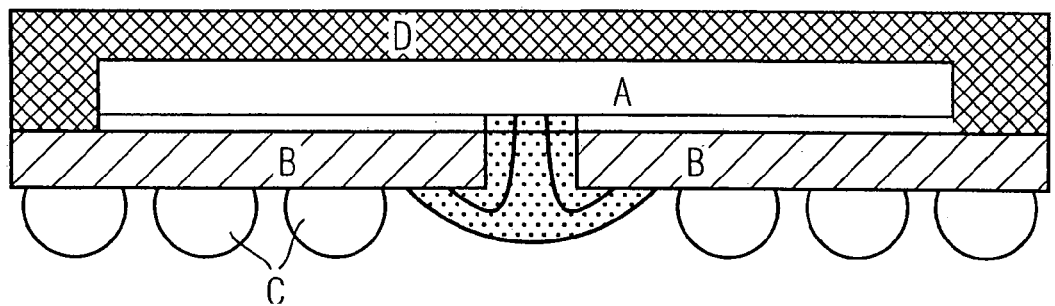
FIG. 17 shows a cross-sectional side view of a semiconductor device showing the deficiencies of the prior art.
Figure 18:
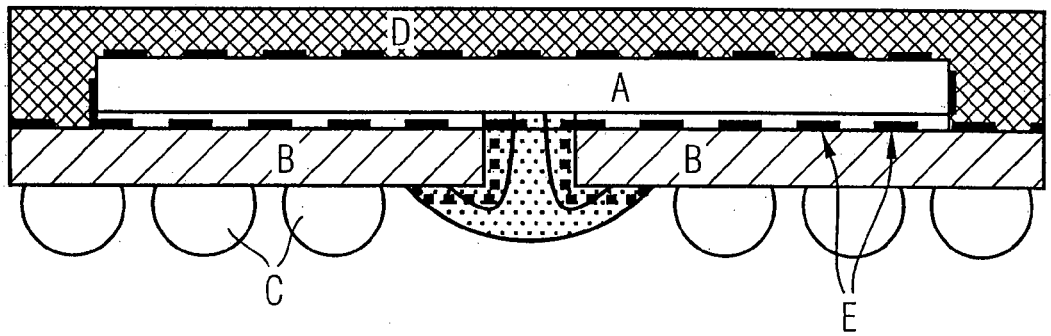
FIG. 18 shows a cross-sectional side view of a semiconductor device showing thermally induced stress at the device of FIG. 17.

A more general way of describing one aspect of the present invention is disclosed with respect to FIG. 16. The chip 10 is attached to the substrate 11 only punctual at attachment point P1110. The compensation means 20 is attached to said chip 10 via attachment means 21 especially at P1020. On the other hand, compensation means 20 is attached to said substrate 11 punctual at attachment point P2011. The properties of said elements especially their coefficients of thermal expansion CTE are as described with respect to FIG. 7. The following equation:

$$\oint_y CTE \cdot \vec{ds} =$$
$$\int_{P2011}^{P1020} CTE20 \cdot \vec{ds} + \int_{P1020}^{P1110} CTE10 \cdot \vec{ds} + \int_{P1110}^{P2011} CTE11 \cdot \vec{ds} = 0$$

expresses a requirement for one aspect of the present invention, meaning that the path integral along all closed paths through said points P2011, P1020, and P1110 within the package in sum result in 0. Thereby thermomechanical tensions and stress can be prevented.

While the invention has been particularly shown and described with reference to the preferred embodiments thereof, it will be understood by those skilled in the art that various changes in form and details may be made without departing from the spirit and the scope of the invention particularly as claimed. Especially various combinations of particular features in each of the preferred embodiments can be used in the other embodiments described herein.

What is claimed is:

1. A semiconductor device, comprising:
   a substrate having a first coefficient of thermal expansion (CTE) for carrying a semiconductor chip on a first surface of said substrate;
   said semiconductor chip having a second coefficient of thermal expansion different from said first coefficient of thermal expansion;
   means for punctually attaching said semiconductor chip at attachment points thereof to said substrate situated laterally adjacent said semiconductor chip; and
   means for compensating a different thermal expansion between said substrate and said semiconductor chip at said attachment points, said compensation means having a third coefficient of thermal expansion different from said first and second coefficient of thermal expansion of said substrate and said semiconductor chip, respectively and said compensating means being attached to said semiconductor chip and to said attachment points in between said semiconductor chip and said attachment points,
   wherein a silicone slip agent is arranged in between said substrate and said semiconductor chip and in between said substrate and said compensating means, except at said attachment points.

2. A semiconductor device according to claim 1, wherein said semiconductor chip is punctually attached to said substrate in addition via a single attachment point in or near the center of said semiconductor chip.

3. A semiconductor device according to claim 1, wherein said compensation means has a predetermined lateral extension, said predetermined lateral extension of said compensation means being selected dependant from the lateral extension of said semiconductor chip from its center and the distance from said center to said attachment points as well as dependent from said third coefficient of thermal expansion.

4. A semiconductor device according to claim 3, wherein said predetermined lateral extension of said compensating means is determined by multiplying the lateral extension of said semiconductor chip from its center by the difference of the second coefficient of thermal expansion minus the first coefficient of thermal expansion divided by the differefice of the first coefficient of thermal expansion minus the third coefficient of thermal expansion.

5. A semiconductor device according to claim 1, wherein said attachment points are located on compensating lines, i.e. lines where even without attachment no thermally induced relative motion of the chip and substrate occurs.

6. A semiconductor device according to claim 1, wherein said attachment points are arranged crosswise or diagonally or both with respect to said semiconductor chip.

7. A semiconductor device according to claim 1, wherein said semiconductor chip is located in the center of said substrate.

8. A semiconductor device according to claim 1, wherein said substrate is connected to a carrier, i.e. a circuit board on a second surface of said substrate opposite said first surface via solder, preferably solder bumps, or electrically conductive adhesive.

9. A semiconductor device according to claim 8, wherein said substrate has the same or a comparable coefficient of thermal expansion (CTE) as said carrier.

10. A semiconductor device according to claim 1, wherein said semiconductor chip is electrically, connected to a second surface of said substrate through a window, preferably in a center axis, in said substrate via bond wires.

11. A semiconductor device according to claim 1, wherein said chip is electrically connected to the first surface of said substrate via bond wires lateral of said semiconductor chip.

12. A semiconductor device according to claim 1, wherein said attachment points are formed by an adhesive, which preferably is epoxy-based.

13. A semiconductor device according to claim 1, wherein said compensation means consists of a plastic, preferably a polymer.

14. A semiconductor device according to claim 1, wherein said semiconductor chip and said compensating means is located under a protection means, which preferably has the same or a comparable coefficient of thermal expansion as the substrate.

15. A semiconductor device according to claim 14, wherein said protection means covers said semiconductor chip and said compensating means from all sides except the side facing said first surface of said substrate without touching them.

16. A semiconductor device according to claim 14, wherein said protection means consists of a stainless steel, an alloy, nickel silver or plastics, preferably a polymer.

17. A semiconductor device according to claim 14, wherein said protection means is attached to said semiconductor chip punctually via a single attachment point at or near the center of said semiconductor chip.

18. A semiconductor device according to claim 1, wherein said compensation means forms a frame surrounding said semiconductor chip laterally.

* * * * *